United States Patent [19]

Wright

[11] 4,060,758

[45] Nov. 29, 1977

[54] POWER SWITCHING CIRCUIT HAVING A DARLINGTON CONNECTED TRANSISTOR PAIR

[75] Inventor: Owen Edgar Wright, Tring, England

[73] Assignee: Lucas Industries Limited, United Kingdom

[21] Appl. No.: 690,618

[22] Filed: May 27, 1976

[30] Foreign Application Priority Data

June 4, 1975 United Kingdom ............... 24066/75

[51] Int. Cl.² ............................................. G05F 1/56
[52] U.S. Cl. ........................................ 323/17; 307/254; 307/315; 323/22 T; 323/DIG. 1; 363/89
[58] Field of Search ................... 321/2; 323/17, 22 T, 323/DIG. 1; 307/296, 297, 315, 254; 363/18, 19, 89

[56] References Cited

U.S. PATENT DOCUMENTS

| | | | |
|---|---|---|---|
| 3,093,790 | 6/1963 | Ehret | 323/DIG. 1 |
| 3,600,666 | 8/1971 | Gliever | 323/22 T |
| 3,612,909 | 10/1971 | Imabayashi | 307/315 |
| 3,781,654 | 12/1973 | Simcoe | 323/17 |

*Primary Examiner*—Gerald Goldberg
*Attorney, Agent, or Firm*—Kane, Dalsimer, Kane, Sullivan and Kurucz

[57] ABSTRACT

A switching circuit has an output transistor between an input and an output conductor, and a drive transistor, the transistors being Darlington-connected. A transformer has one winding in the collector circuit of the drive transistor and another winding across the base-emitter junction of the output transistor, the windings being arranged so that a falling collector current to the drive transistor induces a reverse bias current in the base-emitter junction of the output transistor.

6 Claims, 1 Drawing Figure

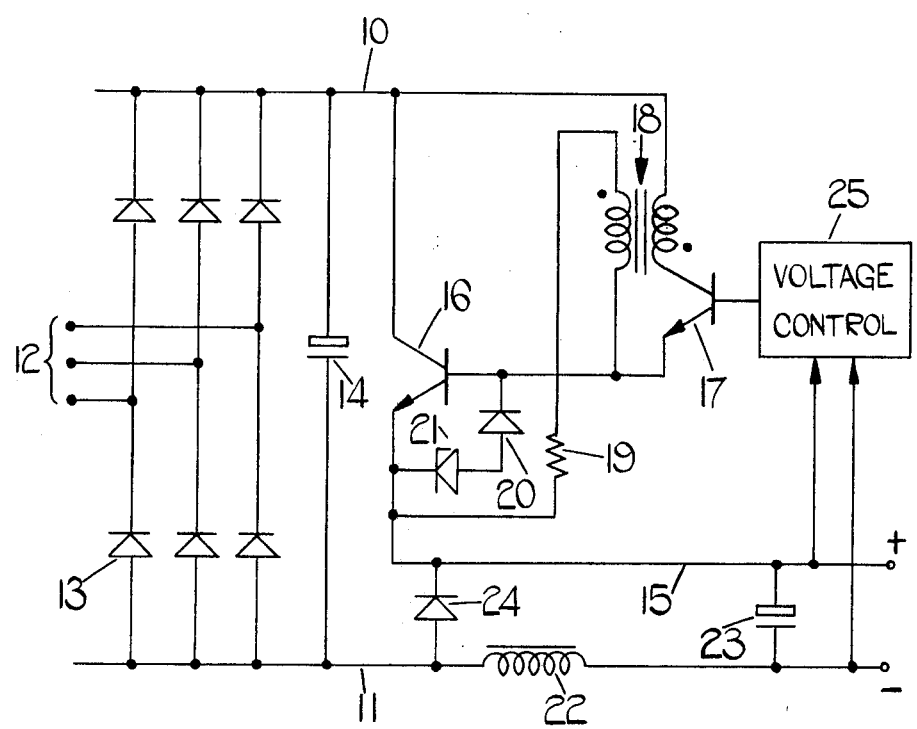

POWER SWITCHING CIRCUIT HAVING A DARLINGTON CONNECTED TRANSISTOR PAIR

This invention relates to a power switching circuit which is of particular, but not exclusive, utility in switching mode d.c. voltage regulators.

It has already been proposed to utilise a Darlington connected pair of transistors in a switching circuit so as to make use of the high current gain available and avoid drawing high current from the control circuit. The circuit does not, however, operate satisfactorily when the drive transistor of the Darlington pair is reverse biased to turn off the transistors since only a small reverse bias current is applied to the output transistor of the pair. This has the effect that the output transistor switches off relatively slowly resulting in excessive power dissipation therein during turn-off.

It is an object of the invention to provide a power switching circuit including a Darlington connected transistor pair in which this disadvantage is at least reduced.

A power switching circuit in accordance with invention comprises a first supply conductor, a first output conductor, an output transistor having its collector connected to one conductor and its emitter connected to the other conductor, a drive transistor having its emitter connected to the base of the output transistor and its base connected to a control circuit and a transformer having one winding connecting the collector of the drive transistor to said one conductor and another winding connecting the emitter of the drive transistor to the emitter of the output transistor, the transformer being wound so that falling current in the collector of the drive transistor induces reverse bias current in the base-emitter junction of the output transistor.

An example of the invention is shown in the accompanying drawing which is the circuit diagram of of a switched mode d.c. voltage regulator.

The circuit shown includes positive and negative supply conductors 10, 11 supplied from a three phase a.c. supply 12 via a full wave rectifier 13. A smoothing capacitor 14 is connected between the conductors 10, 11. The circuit has an output conductor 15, the voltage on which is determined by an n-p-n output transistor 16 operated in the switching mode.

The collector and emitter of the transistor 16 are connected respectively to the conductors 10 and 15 and the base of the transistor 16 is connnected to the emitter of an n-p-n drive transistor 17, the base of which is connected to the output terminal of a known switching control circuit 25 which provides a pulsed output with its mark-space ratio varying in known manner in accordance with the voltage on the conductor 15, to cause the average voltage on conductor 15 to approach a predetermined value.

The collector of the drive transistor 17 is connected via one winding of a pulse transformer 18 to the conductor 10 and another winding of this transformer connects the emitter of the drive transistor 17 via a resistor 19 to the emitter of the transistor 16. The windings of the transformer 18 are arranged so that falling current in the collector of the drive transistor 17, induces reverse bias current in the base-emitter junction of the output transistor 16. This has the result of turning the output transistor 16 off very rapidly and thereby minimising the power dissipated by the output transistor 16 during switch off.

A diode 20 has its cathode connected to the base of the output transistor 16 and its anode connected to the anode of a zener diode 21. The cathode of the zener diode 21 is connected to the emitter of the transistor 16. This connection limits the reverse bias which can be applied to the base-emitter junction of the transistor 16.

The resistor 19 prevents the transformer winding from by-passing the forward drive current to the output transistor, whilst the load current is switched on.

For smoothing the output of the circuit a choke 22 is connected between the rail 11 and the negative output terminal, a capacitor 23 is connected between the conductor 15 and the negative output terminal and a diode 24 has its cathode connected to the conductor 15 and its anode connected to the conductor 11. During the 'off' periods the energy stored by the choke is released and current flows to the load via the diode 24.

It will be appreciated that p-n-p transistors could be substituted for the n-p-n transistors 16, 17 (with a suitably modified voltage control circuit). The collector of the drive transistor 17 would be connected to the output conductor via the transformer 18, the secondary winding of which would be connected as before between the two emitters, the emitter of the output transistor 16 being connected to the supply conductor 10.

I claim:

1. A power switching circuit comprising a first supply conductor, a first output conductor, an output transistor having its collector connected to one conductor and its emitter connected to the other conductor, a drive transistor having its emitter connected to the base of the output transistor and its base connected to a control circuit and a transformer having one winding connecting the collector of the drive transistor to said one conductor and another winding connecting the emitter of the drive transistor to the emitter of the output transistor, the transformer being wound so that falling current in the collector of the drive transistor induces reverse bias current in the base-emitter junction of the output transistor.

2. A circuit as claimed in claim 1 which includes means for limiting the reverse bias at the base-emitter junction of the output transistor.

3. A circuit as claimed in claim 2 in which said reverse-bias limiting means comprises two diodes connected back to back between the base and emitter of said output transistor, one of said diodes being a zener diode.

4. A circuit as claimed in claim 1 which includes control means, responsive to the voltage on said output conductor, for supplying a pulsed output to the base of said drive transistor.

5. A circuit as claimed in claim 4 which includes a second input conductor, a second output conductor connected to said second input rail, and a capacitor connected between said first and second output rails.

6. A circuit as claimed in claim 5 which includes an inductor interconnecting said second input and second output conductor.

* * * * *

UNITED STATES PATENT OFFICE
CERTIFICATE OF CORRECTION

PATENT NO. : 4,060,758
DATED : November 29, 1977
INVENTOR(S) : Owen Edgar Wright It is certified that error appears in the above-identified patent and that said Letters Patent are hereby corrected as shown below:

Column 2, line 59, "rail" should be --conductor-- and line 60, "rails" should be --conductors--.

Signed and Sealed this

Sixteenth Day of May 1978

[SEAL]

Attest:

RUTH C. MASON
Attesting Officer

LUTRELLE F. PARKER
Acting Commissioner of Patents and Trademarks